United States Patent [19]
Yamamoto et al.

[11] Patent Number: 5,053,628
[45] Date of Patent: Oct. 1, 1991

[54] POSITION SIGNAL PRODUCING APPARATUS FOR WATER ALIGNMENT

[75] Inventors: Masaki Yamamoto, Tokyo; Takeo Sato, Kawasaki; Yoshiyuki Sugiyama, Ayase; Shinichiro Aoki; Hiroyuki Takeuchi, both of Kawasaki, all of Japan

[73] Assignee: Matsushita Electric Industrial Co., Ltd., Japan

[21] Appl. No.: 550,925

[22] Filed: Jul. 11, 1990

[30] Foreign Application Priority Data

Jul. 13, 1989 [JP] Japan .................. 1-181046
Dec. 27, 1989 [JP] Japan .................. 1-342009

[51] Int. Cl.$^5$ .................................. G06K 7/015
[52] U.S. Cl. ...................... 250/557; 356/401
[58] Field of Search ............ 250/561, 548, 557; 365/399–401

[56] References Cited

U.S. PATENT DOCUMENTS

| | | |
|---|---|---|
| 4,540,277 | 9/1985 | Mayer et al. |
| 4,668,089 | 5/1987 | Oshida et al. .............. 356/401 |
| 4,697,087 | 9/1987 | Wu . |
| 4,780,617 | 10/1987 | Umafate et al. ............ 356/401 |
| 4,795,261 | 1/1989 | Nakat et al. ............... 356/401 |

FOREIGN PATENT DOCUMENTS

62-93718 12/1987 Japan .
63-78004 4/1988 Japan .

OTHER PUBLICATIONS

"Phase Grating as Waferstepper Alignment Marks for all Process Layers", by S. Wittekoek et al.; SPIE vol. 538, Optical Microlithography IV (1985); pp. 24–30.

Primary Examiner—David C. Nelms
Assistant Examiner—Khaled Shami
Attorney, Agent, or Firm—Lowe, Price, LeBlanc & Becker

[57] ABSTRACT

A position signal producing apparatus, for an apparatus for project-printing a pattern on reticle onto a wafer through a project lens with ultraviolet light, for producing a position signal indicative of position of the wafer, comprises: a laser emitting two different frequency components polarized orthogonally with each other which are splitted by a polarizing beam splitter. The first and second components are reflected by first and second mirrors respectively to produce interference fringes at a given place being on an annular region within a circle defined by field angle of the project lens on the reticle through wave plates for circularly-polarizing. Another interference fringes is formed on a diffraction grating of the wafer in correspondence with the interference fringes through the project lens and a lens for achromatizing the project lens at wavelengths of the components. Another interference fringes reflected by the diffraction grating is detected by a photodetector for producing the position signal. The interference fringes may formed on the wafer by another diffraction grating on the reticle illuminated by the first and second components in combination with polarizing elements provided between the reticle and the wafer in replace with the polarizing beam splitter and wave plates.

19 Claims, 9 Drawing Sheets

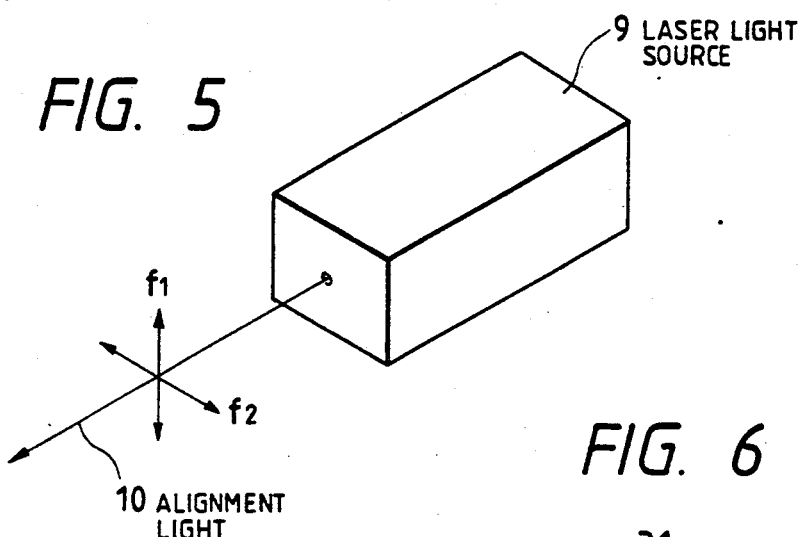
FIG. 5
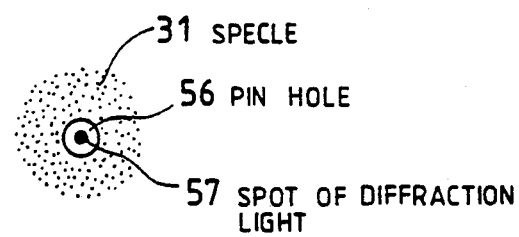
FIG. 6

FIG. 8
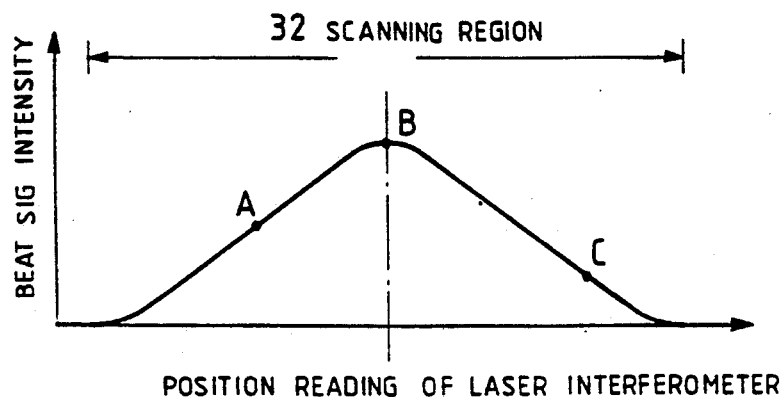

FIG. 10
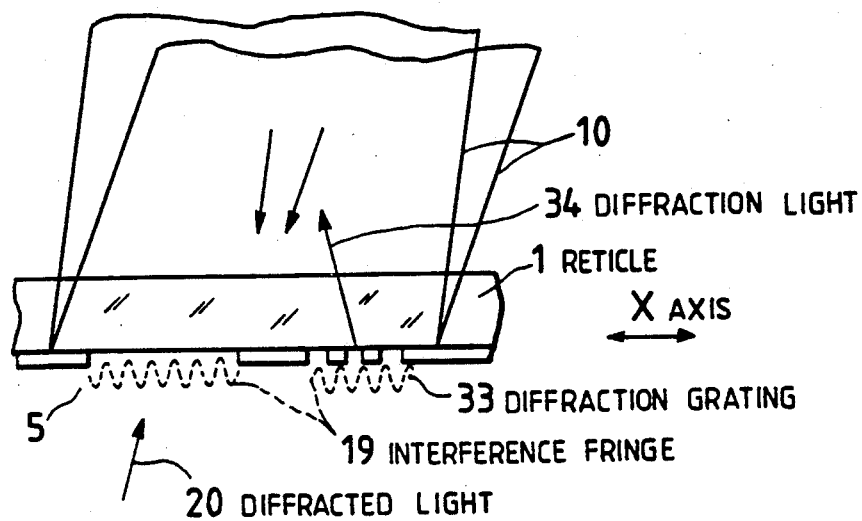
FIG. 11
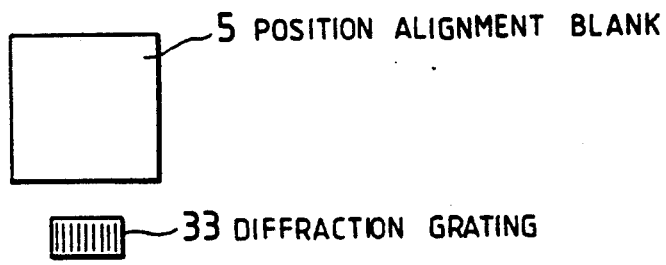
FIG. 12
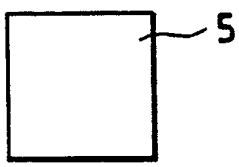

POSITION SIGNAL PRODUCING APPARATUS FOR WATER ALIGNMENT

BACKGROUND OF THE INVENTION

1. Field of the Invention

This invention relates to a position signal producing apparatus for producing a position signal indicative of position along an axis of an wafer on which an image on a reticle is to be projected, used in an exposure apparatus.

2. Description of the Prior Art

Recently, in semiconductor manufacturing apparatus, demand for high density arrangement of elements has been increasingly developed, so that thickness of circuit patterns of each element are reaching to a value lower than 0.5 $\mu$m. In exposing processes of such fine circuit patterns, it is extremely important to consist one pattern position with another pattern at every exposing process to carry out many times of overwrite exposure which is necessary for producing semiconductor products. Such processing requires positioning accuracy of less than 0.1 $\mu$m.

A position signal producing apparatus of a prior art is disclosed in Japanese patent provisional publication No. 63-78004. Hereinbelow will be described the above-mentioned prior art position signal producing apparatus with reference to FIG. 20.

FIG. 20 shows structure of the prior art exposure apparatus with the position signal producing apparatus. In FIG. 20, alignment light emitted from a laser light source 301, which is coherent and includes two frequency components. The alignment light is splitted into two light beams by a half mirror 302 and is diffracted by a first pair of diffraction gratings 304a and 304b formed on a reticle 303 respectively. Each diffracted light is projected onto a second pair of diffraction gratings 310a and 310b provided on a wafer 309 through a spatial filter 306a and 306b, a second lens system 307a and 307b, a projecting optical system 308. The diffracted light 311a and 311b is introduced into photodetectors 312a and 312b in the opposite direction through the projecting optical system 308 and the second lens systems 307a and 307b. When two beams are projected onto the second diffraction gratings 310a and 310b on the wafer 309 with suitable directions respectively, each diffraction light is diffracted in the direction such that diffracted light overlaps each other and interfere with each other. Light intensities of a pair of interfered diffracted light are detected by photodetectors 312a and 312b. The detected results are compared by a comparator 313. In accordance with the detected results, a control system 314 drives the wafer 309, so that difference of the above-mentioned diffracted light intensity equals zero. Thus, position aligning between the reticle 303 and wafer 309 is performed.

On the other hand, the pattern of the reticle 303 is illuminated by a projecting light source 315 and illumination optical system 316. The project image is focused onto the wafer 309 through the project lens 308.

However, the above-mentioned prior art structure is effective only when wavelengths of exposure light emitted from the project light source 315 and the alignment light emitted from the laser light source 301 substantially equal to each other and the project optical system 308 displays good focusing characteristic to both light. It is very difficult to build up an achromatic project optical system where ultraviolet light is used for exposure light, on the other hand visible light is used for alignment. This is because kinds of glass materials for making up a refracted optical system are limited at wavelength of ultraviolet light. For example, ultraviolet light is generated by a KrF excimer laser.

In other words, the project optical lens 308 is so designed as to sufficiently achromatize at exposure wavelength and thus, shows large chromatic aberration for other wavelength light. Therefore, it is desired that wavelength of the alignment light is sufficiently close to that of the exposure light. However, from point of view of producing semiconductor process, it is desired the wavelength of the alignment light is sufficiently separated from that of the exposure light. This is because a resist layer may be exposed by and respond to the alignment beam with a high sensitivity. For example, a chemically sensitized resist and a multilayer resist used for compensation of limit of focusing characteristic of the project optical system 308 may be used. Further, a resist layer containing die for preventing multi-reflection may absorb the alignment beam whose wavelength is close to that of the exposure light. In other words, wavelength of the alignment beam should be sufficiently separated from that of the exposure light from the reasons of semiconductor manufacturing process. Therefore, in the above-mentioned prior art structure, there is a problem that position alignment between the reticle and the wafer with high accuracy is difficult.

SUMMARY OF THE INVENTION

The present invention has been developed in order to remove the above-described drawbacks inherent to the conventional position signal producing apparatus.

According to the present invention there is provided a position signal producing apparatus, for use with an exposure apparatus for project-printing a pattern on reticle onto an wafer through a project lens system with exposure light, for producing a position signal indicative of position of the wafer along an axis, comprising: a light source for emitting coherent light being different from that of the exposure light; a device including: beam splitter for splitting the coherent light into first and second light beams; first mirror for reflecting the first light beam toward a given place of the reticle, the given place being on an annular region within a circle defined by field angle of the project lens system on the reticle; and a second mirror for reflecting the second light beam toward the given place to produce first interference fringes having a pitch of n1 together with the first light beam, the device being arranged to make stripes of the interference fringes perpendicular to the axis; an achromatizing optical system provided between the reticle and the project lens system for receiving the first and second light beams passed through the reticle and for achromatizing the project lens system at wavelengths of the coherent light to form second interference fringes on the wafer in correspondence with the first interference fringes with chromatic aberration removed; a diffraction grating formed on the wafer where the second interference fringes is to be made by the project lens system and the achromatizing means, the diffraction grating producing a position light signal by interference of the diffraction grating with the second interference fringes and for reflecting the second interference fringes by diffraction, pitch of the diffraction grating being n2, stripes of the diffraction grating being arranged perpendicular to the axis, the pitches n1 and n2 being selected such that they make a ratio of an integer; and a photodetector responsive to the position light signal from the diffraction grating received through the project lens system, the achromatizing optical system, and the reticle for producing the position signal in accordance with intensity of the position light signal.

According to the present invention there is also provided an apparatus as mentioned-above, further comprising: a second diffracting grating provided on the reticle and adjacent to the given place for producing a second position light signal by interference of the second diffraction grating with the interference fringes formed on the reticle and for reflecting the interference fringes by diffraction, stripes of the second diffraction grating being arranged perpendicular to the axis; and a second photodetector responsive to the second light signal for producing a second position signal from the second diffraction grating.

According to the present invention there is further provided a position signal producing apparatus, for use with an exposure apparatus for project-printing a pattern on reticle onto an wafer through a project lens system with exposure light, for producing a position signal indicative of position of the wafer along an axis, comprising: a light source for emitting coherent light including first and second components, the first and second components being polarized orthogonally with each other, the frequencies of the first and second components being different from each other and also different from that of the exposure light; a first diffraction grating provided on a given place of the reticle, the given place being on an annular region within a circle defined by field angle of the project lens system on the reticle, stripes of the first diffraction grating being arranged perpendicular to the axis; a light stop provided between the first diffraction grating and the project lens system for stopping non-diffracted the first and second components from the diffraction grating and transmitting diffracted the first and second components from the diffraction grating; achromatizing optical system provided between the reticle and the project lens system for receiving the first and second components from the diffraction grating and for achromatizing the project lens system at wavelengths of the first and second components to form interference fringes onto the wafer in correspondence with the first diffraction grating with chromatic aberration removed, pitch of the interference fringes being n1; a second diffraction grating formed on the wafer where the interference fringes is to be made by the project lens system and the achromatizing means, the second diffraction grating producing a position light signal by interference of the second diffraction grating with the interference fringes and for reflecting the interference fringes by diffraction, pitch of the diffraction grating being n2, stripes of the diffraction grating being arranged perpendicular to the axis, the pitches n1 and n2 being selected such that they makes a ratio of an integer; first and second polarizing elements responsive to the first and second components from the first diffraction grating for circularly-polarizing the first and second light beams respectively to move fringe pattern of the interference fringes along the axis and thereby, the position signal being modulated by frequency difference between the first and second components; and photodetector responsive to the position light signal from the second diffraction grating received through the project lens system, and the achromatizing optical system for producing the position signal in accordance with intensity of the position light signal.

BRIEF DESCRIPTION OF THE DRAWINGS

The object and features of the present invention will become more readily apparent from the following detailed description taken in conjunction with the accompanying drawings in which:

FIG. 5 is a perspective view of a light source used throughout embodiments of the invention;

FIGS. 6, 7A, 7B, 7C, and 8 are drawings for explaining operation throughout embodiments of the invention;

FIG. 10 is an enlarged side view of a portion indicated by arrow IX in FIG. 9;

FIGS. 11 and 12 are enlarged plane views of a portion indicated by arrow IX in FIG. 9;

The same or corresponding elements or parts are designated at like references throughout the drawings.

DETAILED DESCRIPTION OF THE INVENTION

Hereinbelow will be described a first embodiment with reference to the drawings.

Figure 1:
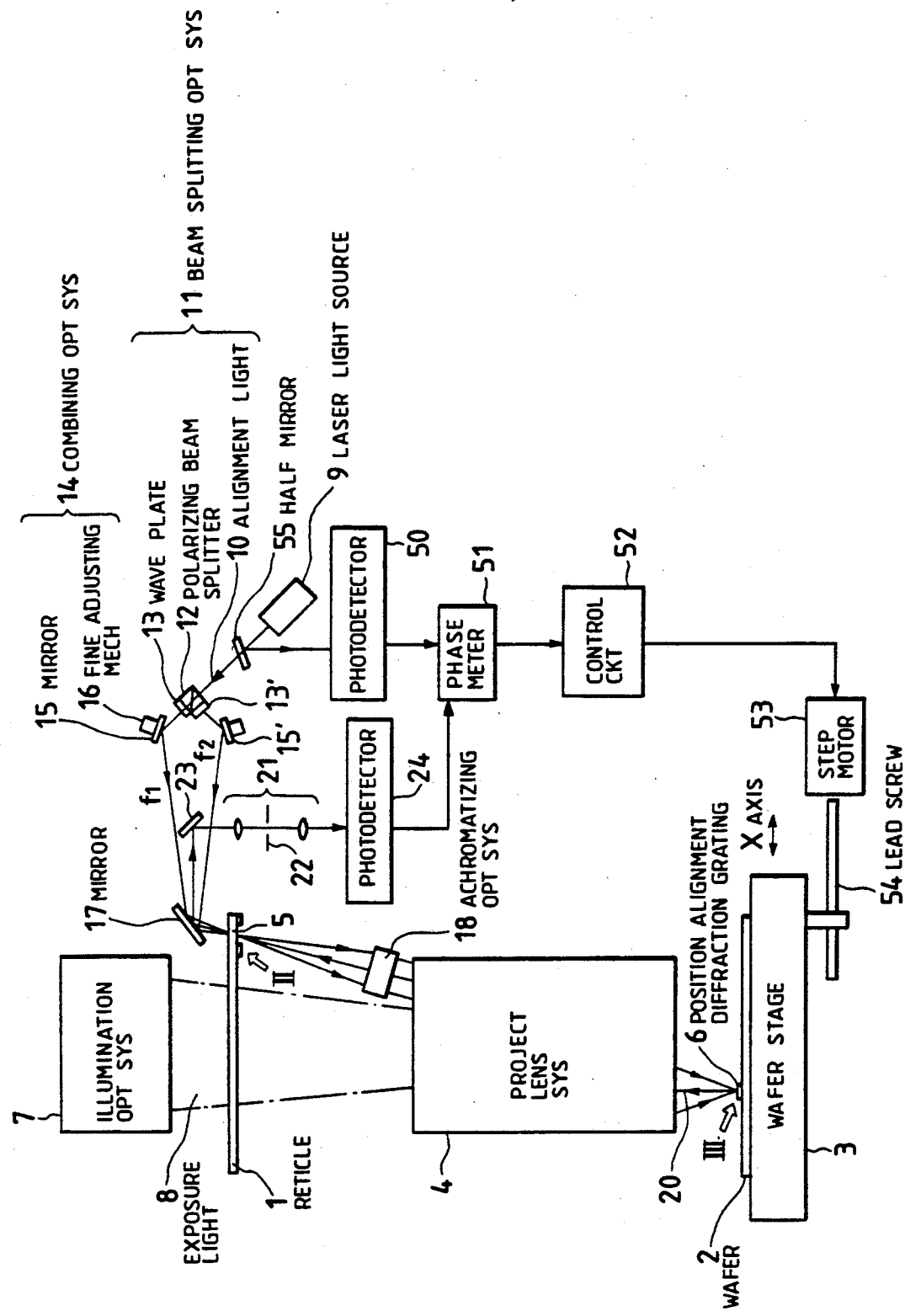
FIG. 1 is a schematic illustration of position signal generating apparatus of a first embodiment of the invention.

FIG. 1 is a schematic illustration of the position signal producing apparatus.

In this embodiment, only positioning alignment in X axis out of X, Y, and $\theta$ axes is described. However, positioning alignment of other axes can be carried out in the same manner.

In FIG. 1, a reticle 1 as a first object is illuminated by an illumination optical system 7 for projecting a circuit pattern onto an wafer 2 as a second object by a project lens system 4. The wafer 2 is moved by an wafer stage 3 along X axis. The reticle 1 is arranged on an objective plane of the project lens system 4. The wafer 2 is arranged on an imaging plane of the project lens system 4. A position alignment blank 5 is provided at a peripheral portion of field angle of the project lens system 4 on the reticle 1. A position aligning grating 6 is provided at portion corresponding to the position alignment blank 5, on the wafer 2 with respect to the project lens system 4. The illumination optical system comprises a KrF excimer laser for emitting ultraviolet light. Numeral 8 is exposure light transmitted through an illumination optical system 7. A light source 9 emits coherent alignment light 10 including two different frequency components f1 and f2, each component being polarized orthogonally with each other. Such light source 9 comprises a Zeeman laser. The alignment light 10 emitted by the laser light source 9 enters a beam splitting optical system 11 comprising a polarizing beam splitter 12 for splitting the alignment light 10 emitted from the laser light source 9, wave plates 13 and 13' for respectively circularly polarizing frequency components f1 and f2 splitted by the polarizing beam splitter 12. The wave plates 13 and 13' can be provided between the reticle 1 and the wafer 2. The alignment light 10 passed the beam splitting optical system enters a combining optical system for combining frequency components f1 with f2 to producing interference fringes 19 on the position alignment blank 5, comprising mirror 15 and 15' for reflecting the frequency components f1 and f2 splitted by the beam splitting optical system 11, and a fine adjustment mechanism 16 provided to the mirror 15 for adjusting an angle of the mirror 15. Numeral 16 is a mirror reflecting the frequency components f1 and f2 reflected at the mirror 15 and 15' respectively toward the position aligning blank 5 of the reticle 1 with frequency components f1 and f2 interfered with each other. An achromatizing optical system 18 is provided between the position alignment blank 5 and the project lens system 4 for achromatizing the project lens system 4 to reproduce the progressive type interference fringes 19 (see FIG. 2) on the position alignment diffraction grating 6 as interference fringes 30. The interference fringes 30 formed on or above the position alignment diffraction grating 6 is diffracted by the position alignment diffraction grating 6. Numeral 20 is diffracted light diffracted by the position aligning diffraction grating 6 and advances perpendicularly to the wafer 20. Numeral 21 is a spatial filtering optical system comprising a spatial filter 22 for transmitting only a middle portion of the light beam reflected by the mirrors 17 and 23, coming from the position alignment grating 6 through the project lens system 4, achromatizing optical system 18, and reticle 1. Numeral 24 is a photodetector into which diffracted light 20 transmitted through the spatial filtering optical system 21 is introduced.

Figure 17:
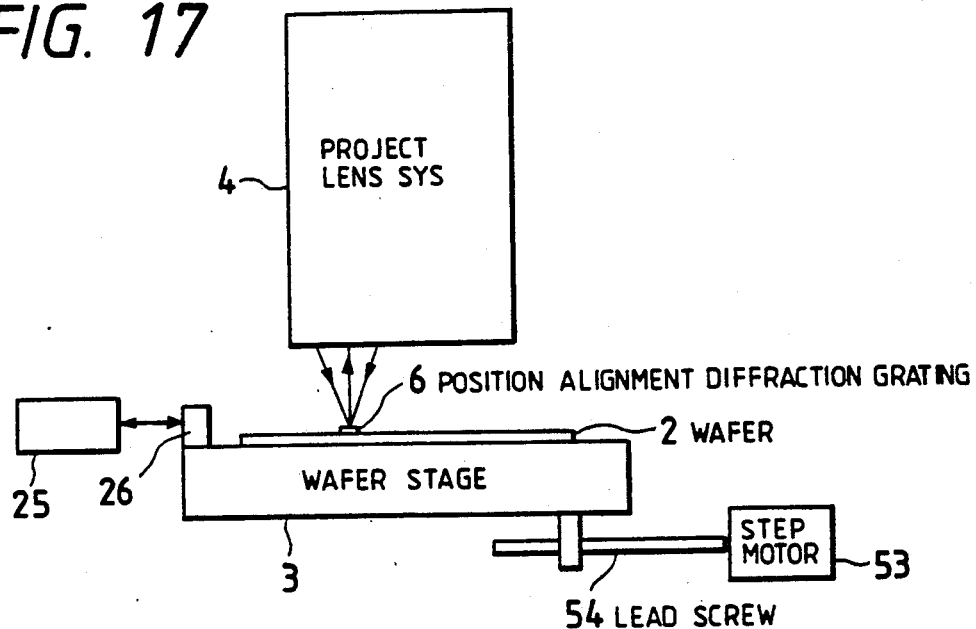
FIG. 17 is an schematic illustration for showing method for coarse position measurement.

FIG. 17 shows a method for coarse aligning of position of the wafer 2 and for obtaining position reading shown in FIG. 8. In FIG. 17, numeral 25 is a laser interferometer for measuring position of the wafer 2. Numeral 26 is an L shape mirror mounted on the wafer stage 3.

More specifically, will be described structure with operation.

Figure 19:
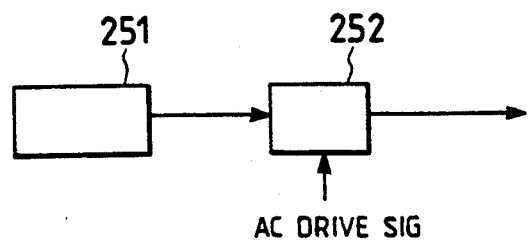
FIG. 19 shows another light source used in throughout embodiments.
Figure 20:
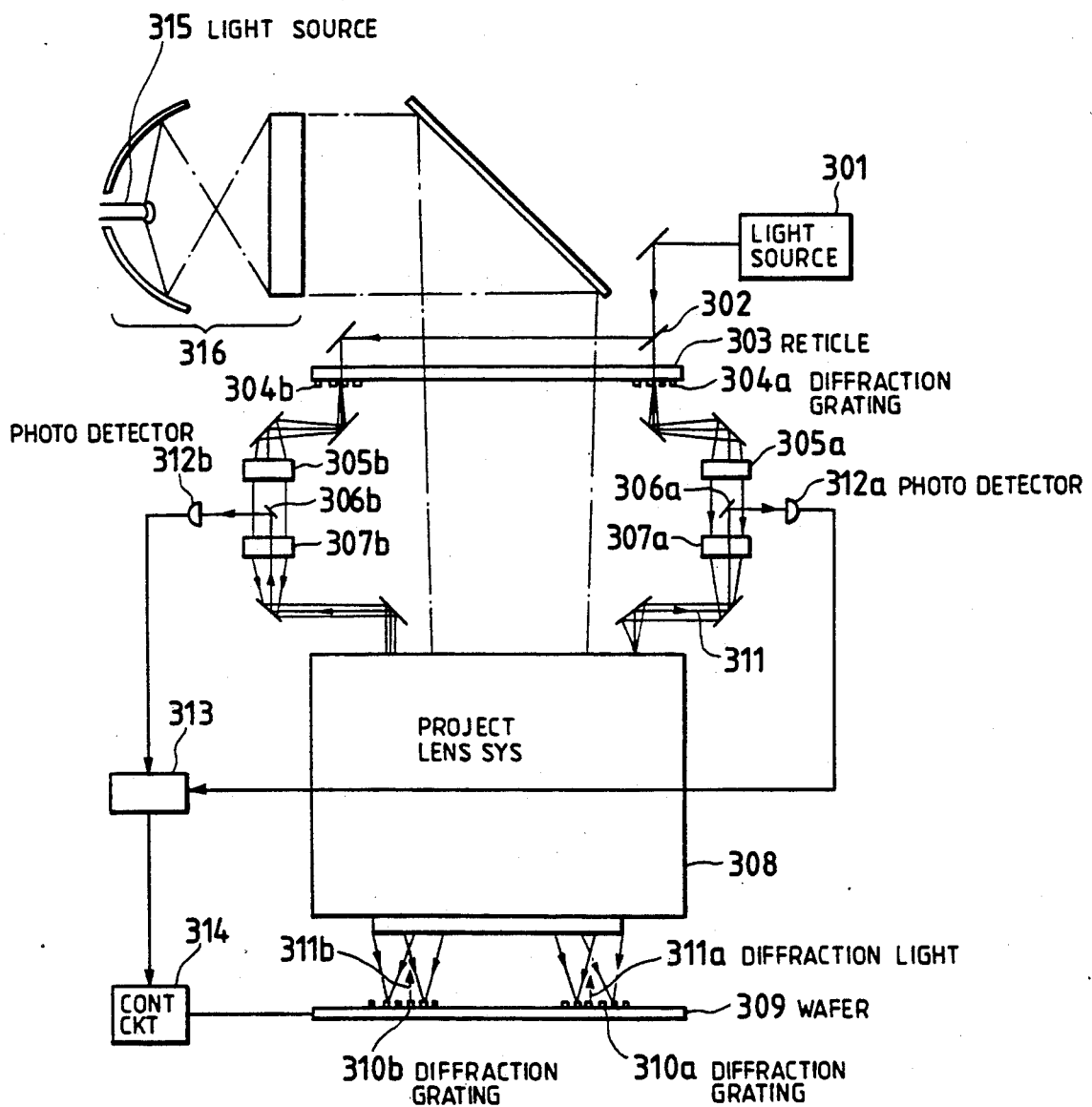
FIG. 20 is a schematic illustration of position signal generating apparatus of prior art.

In FIG. 1, the laser light source 9 for position alignment is an optical unit emitting the coherent alignment light 10 including components of frequencies f1 and f2, each component being polarized orthogonally with each other, as shown in FIG. 5. In this embodiment, a Zeeman laser is used which produces two frequency components, each component orthogonally polarized by application of magnetic field to the laser tube and laser medium is He-Ne, in this embodiment. There are other optical units for generating two frequency light. FIG. 19 shows such light source comprising a laser 251 and an acoustooptic modulator 252 into which laser light from the laser 251 is transmitted. The acoustooptic modulator 252 modulate the laser light in response to an ac drive signal to produce two frequency components. There is also optical unit for generating two frequency components by Doppler shifting the frequency of the laser light with a rotating diffraction grating. Generally, frequency difference between frequencies f1 and f2 is from tens kHz to tens MHz.

The alignment light 10 emitted from the laser light source 9 is splitted into frequency components f1 and f2 by the polarizing beam splitter 12 in the beam splitting optical system 11 and then the frequency component f1 of linearly polarized light is circularly-polarized by the wave plate 13. Further, the frequency component f2 of linearly polarized light is circularly-polarized by the wave plate 13'. The wave plates 13 and 13' can be provided between the reticle 1 and the wafer 2. For the beam splitting optical system 11, an Wollaston prism utilizing double refraction can be used other than the polarizing beam splitter 12 utilizing dielectric multilayer. The frequency components f1 and f2 are circularly-polarized because the linearly polarized light is subject to intensity change by multi-reflection, so that there is little noise margin of alignment signal intensity if linearly polarized light would be used for aligning of the wafer 2.

Figure 2:
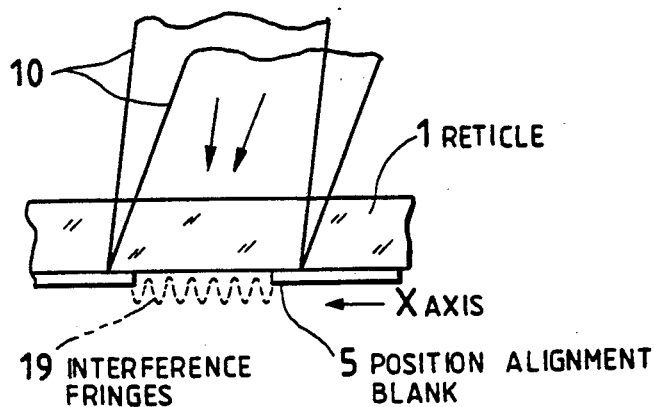
FIG. 2 is an enlarged view of a portion indicated by arrow II in FIG. 1.

The alignment light 10 with f1 and f2 components splitted by the beam splitting optical system 11 is reflected by the mirror 15 of the combing optical system 14 and is projected onto the position aligning blank 5 on the reticle 1 with these components interfered by the mirror 17. Here, it should noted that the interference fringes 19 spreads perpendicularly to the reticle 1 to some extent. The mirror 15 in the combing optical system 14 can be replaced with a prism, etc., utilizing total reflection. The frequency components f1 and f2 of the alignment light 10 are mixed with each other on the position aligning blank 5 and interfered with each other to produce interference fringes 19. Pitch of the interference fringes 19 is adjusted to about 8 μm by adjusting the reflection angle of the mirror 15 with the fine adjustment mechanism 16. This pitch of the interference fringes 19 can be adjusted within several percent for the reasons described later. The frequency components f1 and f2 of the alignment light 10 interfere with each other and an wave pattern of the interference fringes progresses along X axis at beat frequency of f1 and f2, as shown in FIG. 2, though spot of the interference fringes 19 does not move. This interference fringes 19 of progressing waves is referred to as progressive type interference fringes 19. Stripes of the interference fringes is arranged perpendicular to X axis by arranging the polarizing bean splitting optics in a plane including X axis. Stripes of the position alignment diffraction grating is also arranged perpendicular to X axis.

Figure 4:
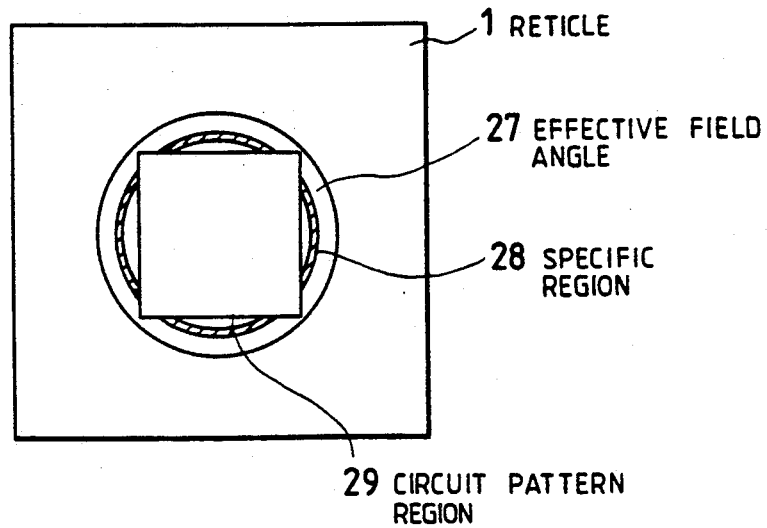
FIG. 4 is a drawing for explaining operation throughout embodiments of the invention.

The exposure light 8 emitted from a KrF excimer laser is projected onto the reticle 1 through the illumination optical system 7. The image of a circuit pattern on the reticle 1 is projected onto the wafer 2 by the project lens system 4. As mentioned, the project lens system 4 is designed to match wavelength of the exposure light 8. Thus, it is impossible to focus the progressive type interference fringes 19 by only the project lens system 4 due to large chromatic aberration. However, it is possible to sufficiently achromatize the project lens system 4 with respect to only a specific region where the progressive type interference fringes 19 is formed on the reticle 1, other than the circuit pattern is formed. Then, the achromatizing optical system 18 achromatizes the project lens system 4 with respect to only the specific region 28 (the same solid torus in the drawing) in the effective field angle 27 of the project lens system 4, as shown in FIG. 4 for example. Thus, the progressive type interference fringes 19 generated within the specific region 28 on the reticle 1 from components f1 and f2 of the alignment light 10 emitted from the laser light source 9 is accurately focused on the wafer 2. In FIG. 4, numeral 29 shows a circuit pattern region.

More specifically, the above-mentioned achromatizing optical system 18 will be described. There are two functions of the achromatizing optical system 18 as follows:

(1) Achromatizing the project lens system 4 due to difference in wavelength between the exposure and position alignment light.

Synthetic quartz used for the project lens system 4 which is suitable for the ultraviolet exposure light 8 ($\lambda = 248.5$ nm) generated by the KrF excimer laser has different refractive indexes between ultraviolet and visible light, such as the alignment light 10. Thus, chromatic aberration of the project lens system 4 so designed as to match the excimer laser light is extremely large at the wavelength of the alignment light 10, so that it is very difficult to design the achromatizing optical system 18 with achromatizing over full field angel of the project lens system 4. Then, achromatizing for a specified region 28 where the position aligning blank 5 exists within the field angle of the project lens system 4, other than the circuit pattern region makes designing of the achromatizing optical system 18 easy. As described above, it is possible to project the progressive type interference fringes 19 generated at wavelengths of the alignment light 10 onto the wafer 2 though a combination of the achromatizing optical and project lens systems with sufficiently small aberration and sufficient MTF.

(2) Compensating projection magnification of the alignment light 10 between the reticle 1 and wafer 2.

The project lens system 4 has a focal length at an wavelength of the alignment light 10 longer than that at the exposure light because the alignment light 10 is longer in wavelength than the exposure light. For example, focal length of the project lens system 4 at He-Ne laser light tens times that of the exposure light, and thus, magnification of the former tens times that of the latter. Further, those image formation positions differ from each other. There are many difficulties in designing of the achromatizing optical system 18 to equalize projection magnification for the alignment light 10 to that for the exposure light 8 under this relationship. Thus, it is desired that the projection magnification for the alignment light 10 is made around one if projection magnification at the wavelength of the exposure light is 1/5. On the other hand, it is difficult in manufacturing and assembling of lenses to make the total magnification of the achromatizing optical system 18 and the project lens system 4 "1.0" accurately with chromatic aberration perfectly compensated. Thus, another compensation mechanism for compensating the error of total magnification is required. This compensation mechanism is the fine adjustment mechanism 16 in the combing optical system. When total magnification is 1.01, the fine adjustment mechanism 16 is so adjusted that the pitch of the progressive type interference fringes becomes 0.99 times unadjsted pitch, so that the pitch of the progressive type interference fringes 30 projected on the wafer 2 (see FIG. 3) can be adjusted to 1.0 accurately. This adjustment is made at assembling of the apparatus. In the above-mentioned adjustment, the total magnification of the project lens system 4 and the achromatizing optical system 18 is performed with respect to zero-order diffraction light, namely, non-diffracted light. Thus, the total magnification is 1.0. However, actually, pitch Pr' of the progressive type interference fringes 30 on the wafer 2 is half of pitch Pr of the progressive type interference fringes 19 on the reticle 1. Thus, the pitch Pr' of the progressive type interference fringes 30 on the wafer 2 is half of pitch Pw of the progressive type interference fringes 19 on the wafer 2 (Pr, Pr', and Pw are natural numbers). This is because light forming the progressive type interference fringes 19 is first order diffraction light. This is described later in connection with Eqs. (1)–(3).

The progressive type interference fringes 19 formed on the reticle 1 is projected through the achromatizing optical system 18 and the project lens system 4 onto the wafer 2 to form another progressive type interference fringes 30 on or above the position alignment diffraction grating 6 again. Position of the wafer 2 is roughly adjusted previously. The diffraction grating 30 formed on or above the position alignment diffraction grating 6 is diffracted. First order diffraction light advances perpendicularly from the wafer 2 as a diffraction light 20. The pitch of the progressive type interference fringes 30 is adjusted to be equal to that of the position alignment diffraction grating 6 on the wafer 2 previously with respect to zero-order diffraction light by adjusting the combing optical system 14. Thus, intensity of the diffracted light 20 developed by the progressive type interference fringes 30 and the position alignment diffraction grating 6 changes with a beat frequency, namely, frequency difference between f1 and f2. When the pattern of the progressive type interference fringes 30 overlaps the position alignment diffraction grating 6 with 0° phase difference, intensity of the diffraction light 20 reaches a maximum. When the progressive type interference fringes 30 overlaps the position alignment diffraction grating 6 with 180° phase difference in period of interference fringes 30, intensity of the diffraction light 20 reaches a minimum. The reason for the pitch Pr' of the interference fringes 30 is made to have half of the pitch Pw of grating 6 on the wafer 2 is efficiency of obtaining the diffraction light 20 is maximum. Because the pattern of the progressive type interference fringes 30 moves in a direction, intensity of the diffracted light 20 changes in sine wave of the beat frequency. Therefore, the intensity change of the diffracted light 20 includes position difference information of the position alignment diffraction grating 6 in the phase of alternative component. Therefore, there is provided accurate position deviation of the wafer 2 from a phase meter 51 to which an intensity signal of the diffracted light 20 detected by the photodetector 24 as a position signal is applied.

The wave plate 13 and 13' are provided for producing the progressive type interference fringes 19 to improve noise margin of the position signal. However, static type interference fringes can be provided as follows:

The wave plates 13 and 13' are removed from the above-mentioned structure. The light source 9 is replaced with a laser light source emitting coherent light with single frequency component. The polarizing beam splitter 12 is replace with a beam splitter for splitting coherent light into two coherent light beams. In such structure, the position signal includes higher noise component. Such position signal indicates wafer position in only its intensity.

Operation of the spatial filtering optical system 21 is described. For example, if a surface of the wafer 2 is rough due to aluminum patterns, the diffraction light 20 also includes speckles generated by the aluminum pattern on Fourier plane of the spatial filtering optical system 21, as shown in FIG. 6. In FIG. 6, speckle pattern 31 can be removed by using a spatial filter 22 which transfers only its center portion around its optical axis on Fourier plane.

An output signal of the photodetector 24 which includes the position information of the wafer 2 in its phase is applied to the phase meter 51 whose another input is supplied with an output of a photodetector 50. The photodetector 50 receives frequency components f1 and f2 from the laser light source 9 through a half mirror 55 as a reference. The phase meter 51 detects phase relationship between the output signal of the photodetector 24 and the output of the photodetector 50. An output of the phase meter with position information is applied to a control circuit 52 for controlling a step motor 53. The step motor 53 drives the wafer stage 3 through a lead screw 54.

In this embodiment, accuracy in mounting position relation between the achromatizing optical system 18 and the project lens system 4 is very important. If position of the achromatizing optical system 18 moves due to some reason, the conjugate relation between the position alignment mark 5 on the reticle 1 and the position alignment mark 6 on the wafer 2 is not realized. Therefore, the achromatizing optical system 18 should be mounted steady with respect to the project lens system 4 with stability for long time interval. Thus, a devising is effective such as the achromatizing optical system 18 manufactured in one piece structure together with the project lens system 4.

Figure 7A:
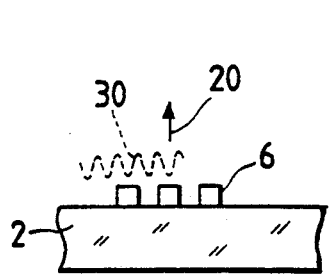
Figure 7B:
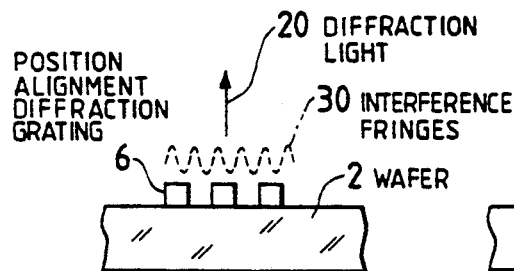
Figure 7C:
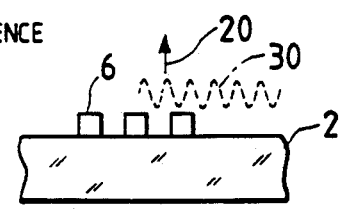

In the above-mentioned position deviation detection has a detection range which is half of the pitch of the interference fringes 30. On the other hand, it is possible to expand detection range by detecting overlapping degree of a projection image of the position alignment blank 6 on the reticle 1 with the position alignment diffraction grating 6. This will be described with referring to FIGS. 1 and 7A-7C. As shown in FIGS. 7A-7C, degree of overlapping of the progressive type interference fringes 30 with the position alignment diffraction grating 6 changes with position of the wafer 2. In FIG. 7A, the number of bars of diffraction fringes 30 overlapping the position alignment grating 6 is about three. Thus, amplitude of the output signal of the photodetector 24 is low. In FIG. 7B, the number of bars of diffraction fringes 30 overlapping the position alignment grating 6 is five or six. Thus, amplitude of the output signal of the photodetector 24 is high. In FIG. 7C, the number of bars of diffraction fringes 30 is about two. Thus, amplitude of the output signal of the photodetector 24 is also low. This change is shown in FIG. 8 where the amplitudes shown in FIGS. 7A-7C are shown by corresponding points A, B, and C in FIG. 8. Generally, a pattern like a triangle as shown in FIG. 8 is obtained as follows:

Position obtained by coordinate of the laser interferometer 25 during scanning of the wafer stage 3 is taken as the axis of abscissa, and amplitude of the beat signal is taken as the axis of ordinate. The beat signal from the photodetector 24 is applied to an unshown amplitude detection circuit. In operation, the wafer 2 mounted on the wafer 2 and its position is measured scanned at a constant speed, as shown in FIG. 17. The wafer stage 3 scans a scan region 32 expected to include a position where position deviation amount is zero. Position of the wafer 2 when position deviation is zero can be obtained by calculating the center position of the triangle shape pattern. This detection accuracy is not sufficient compared with the final position alignment between the reticle 1 and wafer 2. However, there is provided sufficient accuracy by combination of coarse alignment done by detecting maximum amplitude position which provides extremely wide detection range with the above-mentioned position deviation detection by phase detection.

Hereinbelow will be described a second embodiment of the invention.

In the first embodiment, the position deviation detection of the wafer 2 is obtained by providing the progressive type interference fringes 19 on the reticle 1 once and then projecting the progressive type interference fringes 19 onto the wafer 2. In the second embodiment, position alignment is made for not only the wafer 2 but also the reticle 1 at the same time.

Figure 9:
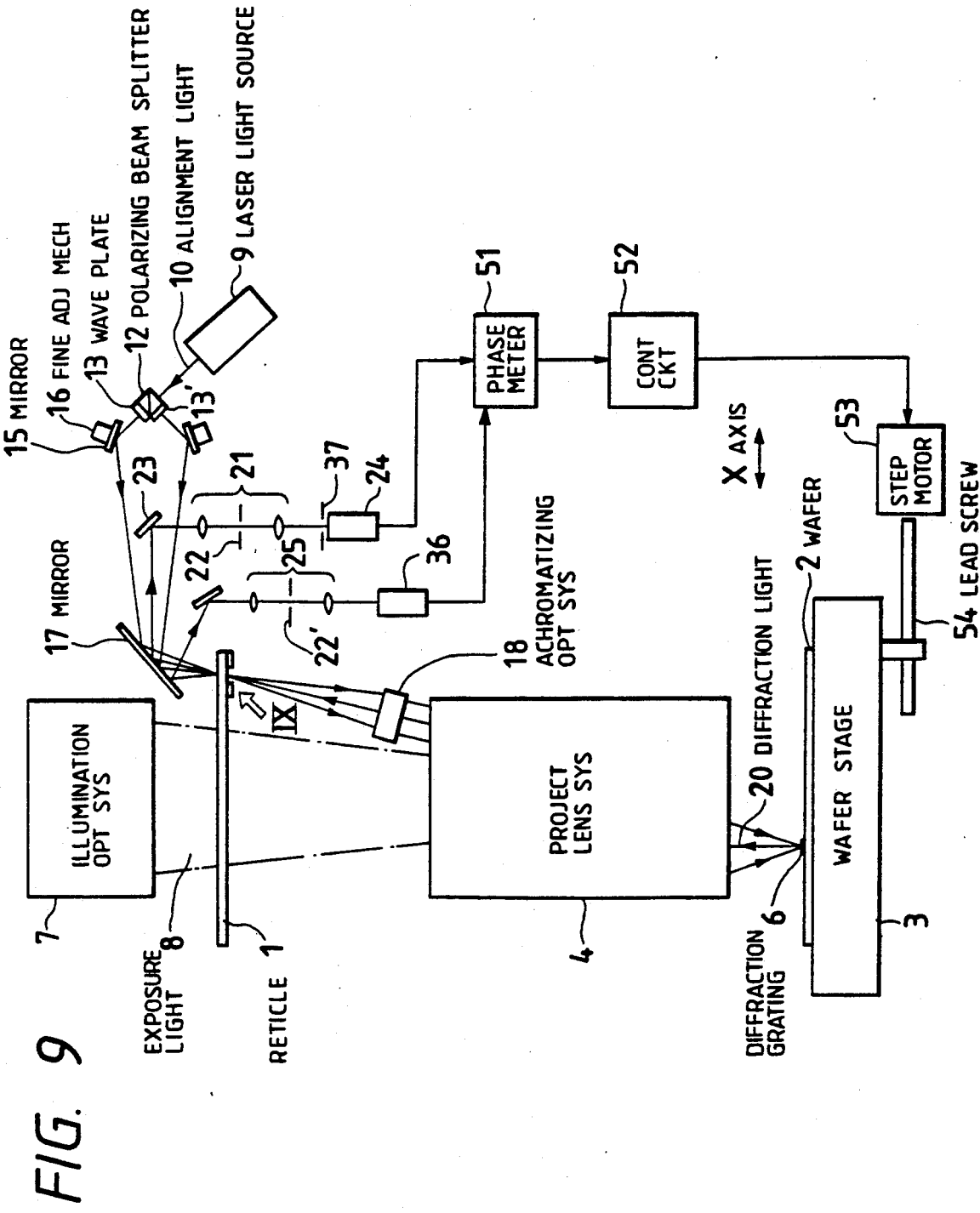
FIG. 9 is a schematic illustration of position signal generating apparatus of a second embodiment of the invention.

FIGS. 9-12 show the second embodiment of the invention. FIG. 9 shows general structure, FIG. 10 is an enlarged view of a portion indicated by arrow IX in FIG. 9, and FIGS. 11 and 12 show arrangement of position aligning marks on the reticle 1.

Basic structure for aligning the wafer 2 is the same as the structure of the first embodiment. In this embodiment, the position alignment diffraction grating 33 is further provided on the reticle 1 adjacent to the position alignment blank 5 as shown in FIG. 10, whose stripes are arranged perpendicular to X axis and diffracted light from the position alignment diffraction grating 33 is detected by another photodetector 36 through another spatial filtering optical system 25. A field diaphragm 22' is provided in front of the photodetector 24 for introducing only light from the position aligning blank 5 into the photodetector 24. Pitch Pr' of the progressive type interference fringes 19 on the reticle 1 is finely adjusted by the combing optical system 14 for the alignment of the wafer 2, so that there is a possibility that pitch error with respect to the position alignment diffraction grating 33 of the reticle 1 occurs. Thus, it is desired that the number of bars of the diffraction grating 33 of the reticle 1 is as few as possible. The reticle 1 comprises a quartz glass plate where chromium patterns are drawn, so that diffraction efficiency is high. Thus, if area of the position alignment diffraction grating 33 of the reticle 1 is small to some extent, there is no trouble to detect the beat signal by the photodetector 36. Pitch Pr2 of the diffraction grating 33 and Pitch Pr' of the progressive type interference fringes 19 are natural numbers. FIG. 11 shows the position alignment diffraction grating 33 of the reticle 1. Beat signals of the photodetectors 24 and 36 provide the relative position alignment between the reticle 1 and wafer 2. Thus, it can be expected that an alignment accuracy of this method higher than that done by separate alignment of the reticle 1 and wafer 2 (through the reticle alignment, or TTR alignment). Moreover, arrangement of position alignment diffraction gratings 33a and 33b as shown in FIG. 12 can be used also. These position alignment diffraction gratings 33a and 33b feature to develop no Abbe's error in detection of relative position deviation amount between the wafer 2 and the reticle 1 even if rotation of the progressive type interference fringes 19 occurs, in other words, the direction of gratings of the position alignment diffraction gratings 33 deviates from a direction of stripes of the progressive type interference grating 19. This is because assuming that patterns of the position alignment gratings 6 and 33 are uniform, position deviation detection amount of the reticle 1 is represented by the center of gravity of the position alignment diffraction gratings 6 and 33, so that the center of gravity of the position alignment diffraction grating 6 of the wafer 1 seemingly consists with that of the position alignment diffraction grating 33 of the reticle 1 irrespective of presence of rotation of the progressive type interference gratings 19.

As described above, in this invention, two different frequency components which are different from that of exposure light, included in the coherent alignment light are projected onto the position alignment blank 5 provided on a specific position where the progressive type interference grating fringes 19 is formed. Position of wafer 1 is detected as same as the first embodiment. The progressive type interference grating fringes 19 is also projected onto the position alignment diffraction grating 33 on the reticle 1 provided adjacent to the position alignment blank 5 diffracting them. The diffracted light 34 is transmitted through the spatial filtering optical system 25 and introduced into the photodetector 36 to detect the beat signal for providing position deviation between the reticle 1 and the wafer 2. The wafer stage 3 is moved to reduce the position deviation for providing accurate position alignment.

Figure 13:
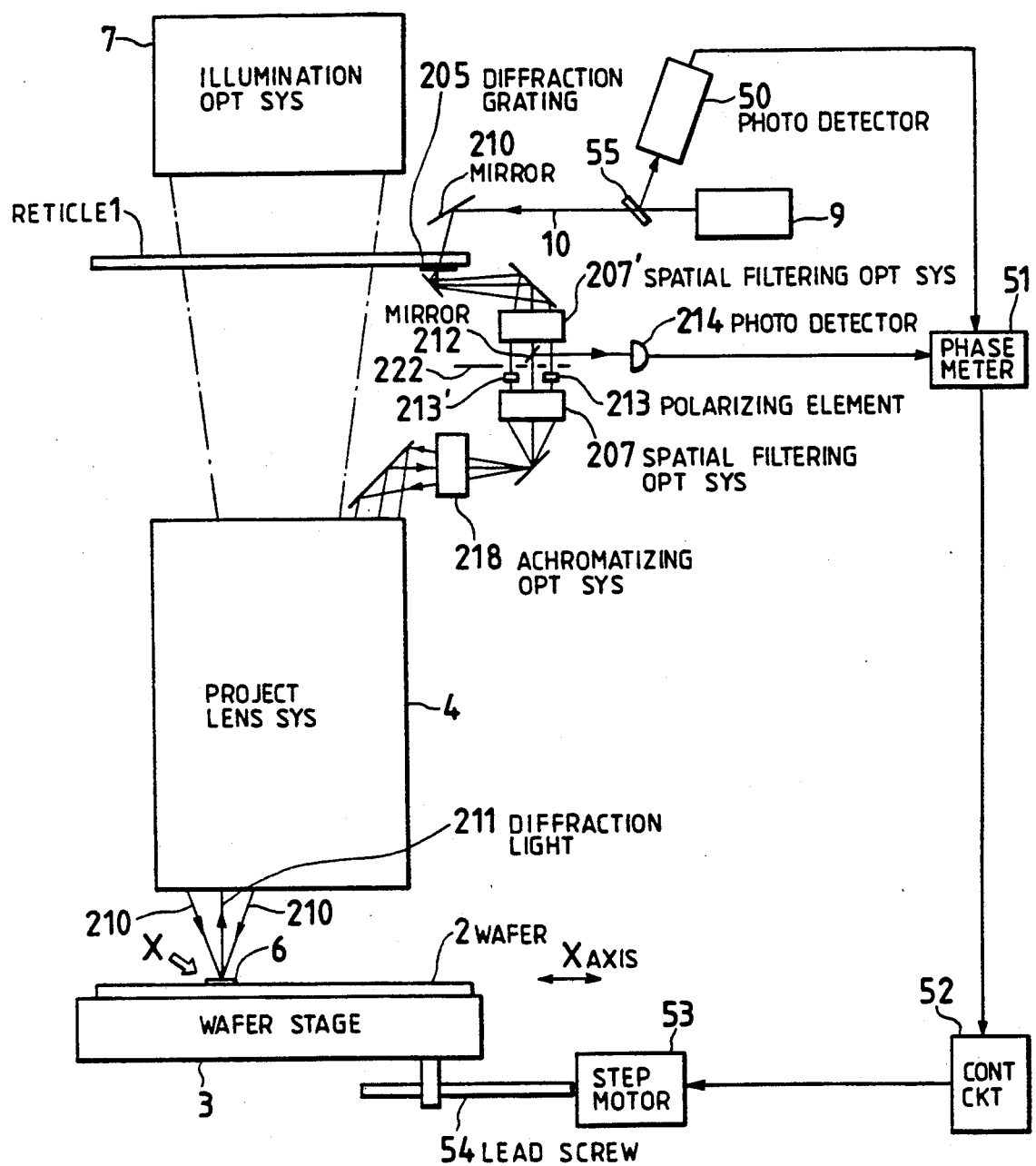
FIG. 13 is a schematic illustration of position signal generating apparatus of a third embodiment of the invention.
Figure 14:
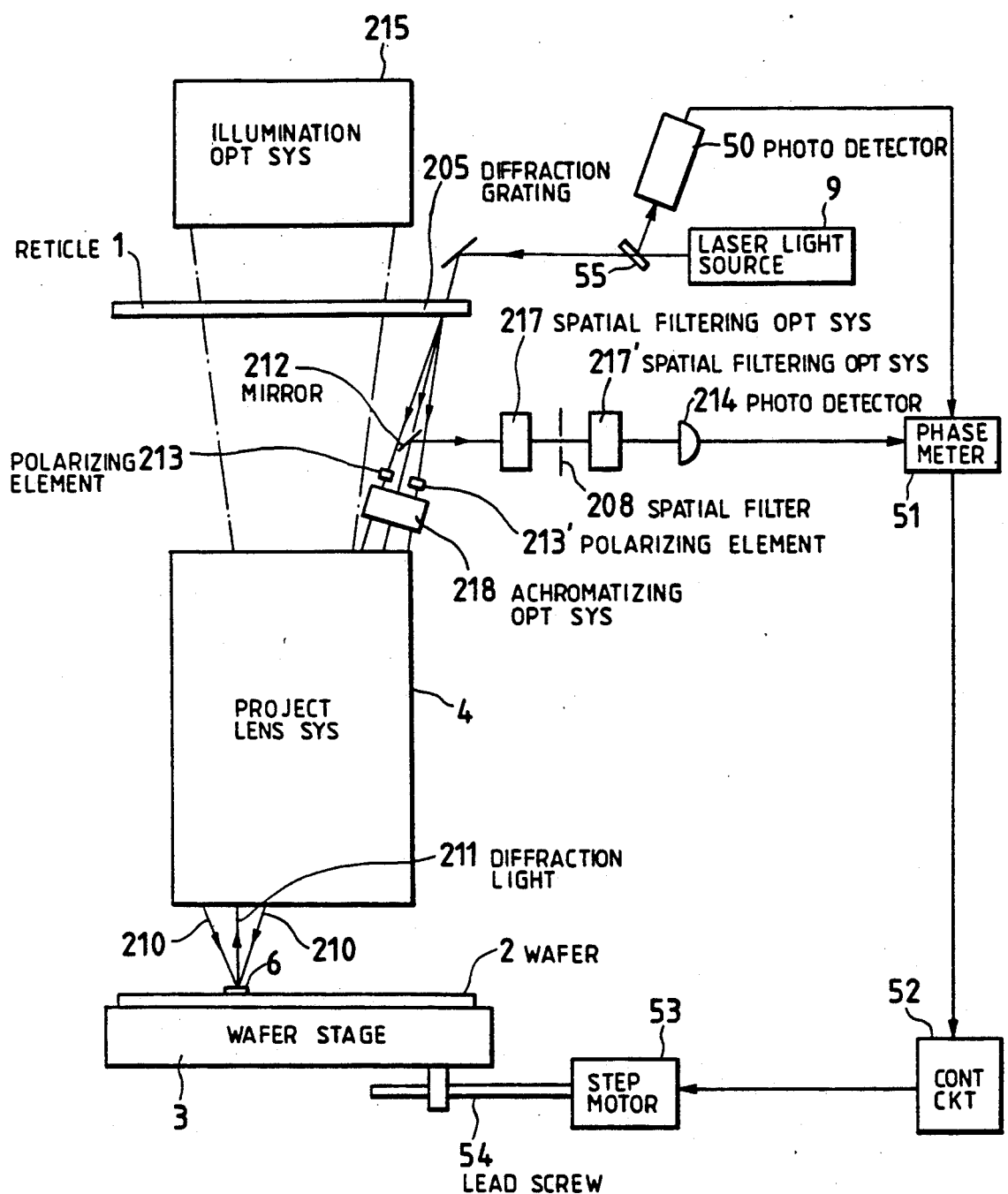
FIG. 14 is a schematic illustration of position signal generating apparatus of a fourth embodiment of the invention.
Figure 15:
FIG. 15 is a top view of the grating shown in FIG. 14.

Hereinbelow will be described a third embodiment of the invention with reference to FIGS. 13-15. FIG. 13 shows structure of a position signal producing apparatus of the third embodiment of the invention. A specific region to be achromatized of the reticle 1, located within field angle of a project lens used in the invention is shown in FIG. 4. FIG. 5 shows polarizing direction of laser light emitted from a laser light source, similar to the first embodiment. In FIG. 13, numeral 1 is the reticle. Numeral 2 is an wafer where a circuit pattern is to be exposed for photolithography. Numeral 9 is a light source. Numeral 205 is a position alignment mark (grating) provided on the reticle 1, whose stripes are arranged perpendicular to X axis. Numerals 207 and 207' are spatial filtering optical systems. Numeral 218 is an achromatizing optical system. Numeral 4 is the project lens system. Numeral 10 is an alignment light. Numeral 6 is a position alignment grating (mark) provided on the wafer 2, whose stripes are arranged perpendicularly to X axis. Numeral 211 is the alignment light diffracted by the position alignment mark 6. FIG. 4 shows an effective field angle 27 and the specific region 28 achromatized with respect to the reticle 1.

In the above-mentioned structure, its operation will be described. The project lens system 4 is provided for projecting an image of the reticle 1 onto the wafer 2. It is impossible that only the project lens system 4 focus the image of the position alignment mark 205 on the reticle illuminated by the alignment light 10 emitted by the light source 4, onto the wafer 2 because there is much chromatic aberration. The position alignment mark 205 on the reticle 1 comprises diffraction grating, so that light transmitted therethrough is splitted into many diffracted light beams. These diffracted light beams are transmitted through spatial filtering optical systems 207 and 207' and a spatial filter 222 for spatial filtering. The total reflection mirror 212 stops first-order diffraction light from the diffraction grating 205. The filtered light is further transmitted through the achromatizing optical system 218 and then, reaches to the position alignment mark 6 on the wafer by the project lens system 4. The achromatizing optical system 218 achromatizes the project lens system 4 with respect to a specific region 28 (the torus or annular region in the drawing) in the effective field angle 27 of the project lens system 4, as shown in FIG. 4. The position alignment mark 205 illuminated by the alignment light 10, existing in the specific region 28 on the reticle 1 is projected and focused onto the wafer 2 accurately. In other words, since the refraction index of quartz, etc. used in the project lens with respect to the actual exposure light KrF excimer laser ($\lambda=248.8$ nm) is largely different from that with respect to a visible light, such as the alignment light 10. Thus, chromatic aberration of the project lens system 4 with respect to the alignment light 10 is extremely large because an optimum design is made for project lens system 4, so that it is very difficult to design a achromatizing optical system capable of achromatizing over full field angle of the project lens system 4. Therefore, design of the achromatizing optical system 218 becomes easier to some extent by achromatization made for only limited region where the position alignment mark 205 in the field angle of the project lens system 4. Assuming that pitch of the position alignment mark 205 on the reticle 1 is Pr, and magnification of the project lens system 4 at wavelength of the exposure light is M, pitch Pr' of the diffraction grating 30' focused on the wafer 2 (Pr, Pr', and Pw are natural numbers) is given by:

$$Pr'=(Pr/2)/M \qquad (1)$$

because the project lens system 4 is achromatized as an optical system with magnification M. Moreover, the position alignment mark 6 comprises a diffraction grating whose pitch Pw is given by:

$$Pw=Pr/M \qquad (2)$$

Thus, the pitch Pr' of the interference fringes 30 is made to have a half of the pitch Pw of the position alignment mark 205. Therefore, relation between the pitch Pr' of the interference fringes 30 and the pitch Pw of position alignment grating 6 on the wafer is given by:

$$Pr'=Pw/2 \qquad (3)$$

Figure 3:
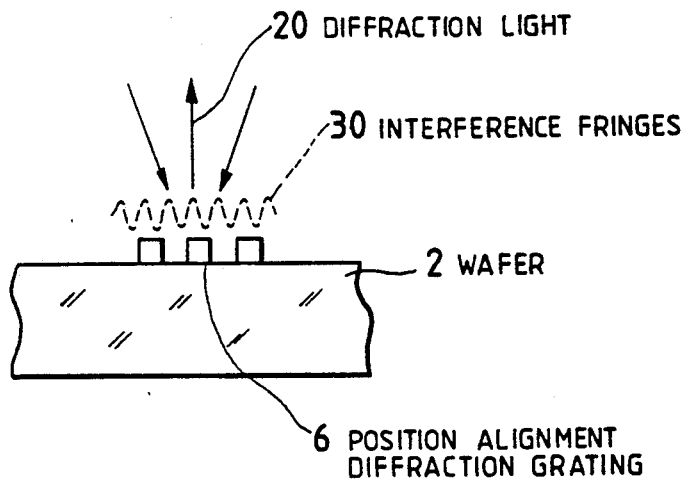
FIG. 3 is an enlarged view of a portion indicated by arrow III in FIG. 1.
Figure 18:
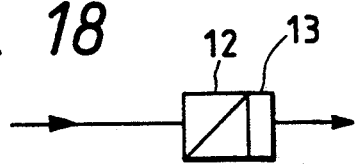
FIG. 18 show a portion of FIGS. 13 and 14.

As the result, light which is subjected to $\pm$ fist order diffraction advances a passage shown by diffraction light 211 and then transmitted through the project lens system 4, the achromatizing optical system 218, the spatial filtering optical system 207 and taken out externally by the total reflection mirror 212 provided in the spatial filter 222 to be entered into the photodetector 214. As the result of it, an output signal of the photodetector 214 provides measurement of position deviation between the reticle 1 and wafer 2. A control circuit 52 controls a step motor 53 in response to the output signal of the photodetector 214. The step motor 53 drives a lead screw 54 for moving the wafer stage 3. Positioning between the reticle 1 and the wafer 2 can be also performed by an unshown stage of the reticle 1 which is the same as the wafer stage 3 in response to the output signal of the photodetector 214, except that controlling direction is opposite. The laser light source 9 is an optical unit emitting the coherent alignment light including components of frequencies f1 and f2, each component being polarized orthogonally with each other, as shown in FIG. 3. For such an optical unit, a Zeeman laser can be used which produces two frequency component light by application of magnetic field to the laser tube. There are other optical units for generating two frequency component light by an optical modulator using ultrasonic waves propagating in one direction or by Doppler shifting the frequency of the laser light with a rotating diffraction grating. Generally, frequency difference between frequencies f1 and f2 is from tens kHz to tens MHz. The light emitted from the light source 9 is transmitted through the position alignment mark 205 on the reticle 1, the spatial filtering lens systems 207 and 207' and reaches to the polarizing optical elements 213 and 213'. The total reflection mirror 212 stops first-order diffraction light from the diffraction grating 205. The polarizing optical elements 213 and 213' transmits either coherent frequency components f1 or f2 of the alignment light in accordance with polarizing direction and further circularly-polarizes the transmitted light respectively. Such polarizing optical elements 213 and 213' can be provided by combination of a polarizing plate or a polarizing beam splitter 12 and a phase plate 13 shown in FIG. 18 which are also shown in FIG. 1 or dielectric multilayer preferably designed and may be provided in the light path between the reticle 1 and the wafer 2.

Figure 16:
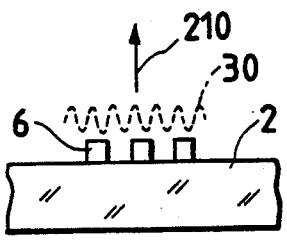
FIG. 16 is an enlarged side view of a portion indicated by arrow X in FIG. 13.

The frequency components f1 and f2 of the alignment light transmitted through the polarizing optical element 213 advance to the wafer 2 through the achromatizing optical system 218, the project lens system 4. On position alignment mark 6, frequency components f1 and f2 are mixed with each other to produce the progressive type interference fringes 30' as shown FIG. 16, similar to the first embodiment. Thus, intensity of the diffracted light 210 developed by the progressive type interference fringes 30' and the position alignment diffraction grating 6 changes with a beat frequency, namely, frequency difference between f1 and f2. When the pattern of the progressive type interference fringes 30' just overlaps the position alignment diffraction grating 6, as shown in FIG. 16, intensity of the diffraction light 20 reaches a maximum. When the progressive type interference fringes 30' overlaps the position alignment diffraction grating 6 with 180° phase difference, intensity of the diffraction light 210 reaches a minimum. Because the pattern of the progressive type interference fringes 30' moves in a direction, intensity of the diffracted light 210 changes in sine wave of the beat frequency. Therefore, the intensity change of the diffracted light 210 includes position difference information of the position alignment diffraction grating 6 in phase of alternative component. Therefore, there is provided accurate position deviation of the wafer 2 from a phase meter to which an intensity signal of the diffracted light 210 detected by the photodetector 214 through the spatial filtering optical system 222. More specifically, the diffracted light and are introduced into the photodetector 214 by the total reflection mirror 212 through the project lens system 4 and the achromatizing optical system 218. Beat corresponding to frequency difference between f1 and f2 by is developed by interference of components f1 and f2 with each other which are circularly polarized. Beat frequency is within frequency detection range of the photodetector 214, so that the photodetector 214 outputs a sine wave b(t) corresponding to the beat. The frequency components f1 and f2 advance through separate passages by function of the polarizing optical element. Thus, the alignment light including f1 and f2 components introduced into the photodetector 14 includes position deviation information of the wafer 2 given by:

$$f1(t) = A1 \sin(2\pi f1 t - 2\pi \Delta x / Pw) \quad (4)$$

$$f2(t) = A2 \sin(2\pi f2 t + 2\pi \Delta x / Pw) \quad (5)$$

where f1(t) and f2(t) are electric field intensities of the alignment light f1 and f2 respectively; A1 and A2 are amplitudes of electric field; and $\Delta x$ is position deviation of the wafer 2 in the horizontal direction of the drawing.

The beat signal b(t) developed by interference of the frequency components f1 and f2 of the alignment light, which is given by:

$$\begin{aligned} b(t) &= K\{f1(t) + f2(t)\}^2 \\ &= K\{A1^2 + A2^2 + 2A1A2\cos(2\pi(f1 - f2)t - 4\pi \Delta x / Pw)\} \end{aligned} \quad (6)$$

where K is a proportional constant. As shown, the beat signal b(t) includes information of position deviation of the wafer $\Delta x$ in its phase of the sine wave. Therefore, the position deviation $\Delta x$ of the wafer 2 with respect to the reticle 1 can be obtained as follows:

Another beat signal including no position deviation $\Delta x$ information is detected by another photodetector 50. The photodetector 50 receives frequency components f1 and f2 from the laser light source 9 through a half mirror 55 as a reference. Two outputs of the photodetector is measured by a phase difference measuring instrument, i.e., a phase meter 51.

Hereinbelow will be described a fourth embodiment of the invention with reference to FIG. 14. FIG. 14 shows structure of position signal producing apparatus of the invention. In FIG. 14, numeral 1 is a reticle which is a mask used for exposing. Numeral 2 is an wafer. Numeral 4 is a light source. Numeral 205 is a position alignment mark provided on the reticle 1, whose stripes are arranged perpendicular to X axis. Numeral 218 is an achromatizing optical system for achromatizing. Numerals 217 and 217' are spatial filtering optical systems. Numeral 10 is an alignment light. Numeral 6 is a position alignment mark provided on the wafer 2, whose stripes are arranged perpendicular to X axis. Numeral 211 is an alignment light diffracted by the position alignment mark 6.

In the above-mentioned structure, operation will be described.

The coherent alignment light 10 including two frequency components emitted from the above-mentioned light source 9 is splitted by a diffraction grating of the position alignment mark 205 on the reticle 1. Zero-order diffracted light is stopped by a total reflection mirror 12. Only ± first order diffraction light enters the above-mentioned polarizing optical elements 213 and 213'. The polarizing optical elements 213 and 213' transmit frequency components f1 and f2 respectively which are focused onto the wafer 2 by the project lens system 4 and the achromatizing optical system 218. The polarizing optical elements 213 and 213' may be provided in light path between the reticle 1 and the wafer 2. The alignment light 211 diffracted by the position alignment mark 6 on the wafer 2 enters a spatial filter 8 through the project lens system 4, the achromatizing optical system 218, the total reflection mirror 312, the spatial filtering optical systems 7 and 7'. The spatial filter 208 removes speckle noise caused by roughness of the surface of the wafer 2 or other noise components and focuses the diffracted light 211 onto the photodetector 214. The photodetector 214 provides a beat signal including position deviation $\Delta x$ of the wafer 2 in phase of the beat signal for the same reason mentioned in the third embodiment of the invention. This provides measurement of accurate position deviation $\Delta x$ of the wafer 2. The output signal of the photodetector 214 provides measurement of position deviation between the reticle 1 and wafer 2. A control circuit 52 controls a step motor 53 in response to the output signal of the photodetector 214. The step motor drives a lead screw 54 for moving the wafer stage 3. Positioning between the reticle 1 and the wafer 2 can be also performed by an unshown stage of the reticle 1 which is the same as the wafer stage 3 in response to the output signal of the photodetector 214, except that controlling direction is opposite.

As mentioned above, embodiments are described, in the third and fourth embodiments of the invention, accuracy in mounting position of the achromatizing optical system 218 and the spatial filtering optical systems 207 and 207' with respect to the project lens system 4 is very important. If position of the achromatizing optical system 218 or the spatial filtering optical systems 207 and 207' moves due to some reason, the conjugate relation between the position alignment mark 205 on the reticle 1 and the position alignment mark 6 on the wafer 2 is not realized. Therefore, the achromatizing optical system 218 and the spatial filtering optical system 207 and 207' should be mounted steadily with respect to the project lens system 4 with stability for long time interval. Further, in the fourth embodiment of the invention mounting accuracy of the achromatizing optical system 218 with respect to the project lens system 4 is important. Thus, a devising is effective such as the achromatizing optical system 218 manufactured in one piece structure together with the project lens system 4.

As described above, according to the first embodiment of the invention, two different frequency components of the alignment light whose frequencies are different from that of the exposure light are interfered with each other at the position alignment mark of a first object to form interference fringes with a given pitch. These interference fringes are projected onto a second object through a compensation optical system and project optical system. Light returned from the position alignment mark of the second object is received by a photodetector after removal of speckle pattern by a spatial filtering optical system. A position deviation signal obtained by phase comparison of a light beat signal obtained by the photodetector provides position alignment by controlling relative positions between first and second object. As described above, even if the alignment light whose wavelength is different from that of the exposure light, position alignment between first and second objects with high accuracy are provided because the compensation optical system compensates chromatic aberration of the project optical system for the specific region where interference fringes are formed by interference of the alignment light.

Further, according to the second embodiment of this invention, there is provided TTL alignment system with high accuracy by projecting position alignment mark comprising a diffraction grating on the reticle is projected onto position alignment mark comprising diffraction grating on the wafer by coherent light whose wavelength differs from that of the exposure light through a achromatizing optical system for sufficient achromatiztion with respect to the region where the position alignment mark exists. Then, the light is received by a photodetector after spatial filtering to provide high accuracy TTL alignment system.

As described above, according to third embodiment of this invention, two different frequency components which are different from exposure light in frequency, included in the coherent alignment light are projected onto the position alignment mark provided on a specific position. Either frequency components f1 or f2 from $\pm$ first order diffracted light of the alignment light is transmitted and projected onto the position alignment mark on the wafer by achromatizing optical system and the project lens. Light diffracted again is introduced into the photodetector after spatial filtering. The photodetector detects a beat signal including position deviation of the wafer with respect to the reticle by detecting phase information. Thus, accurate alignment is obtained by operation of the wafer and reticle in accordance with this position deviation detection amount to remove position deviation.

What is claimed is:

1. A position signal producing apparatus, for use with an exposure apparatus for project-printing a pattern on reticle onto an wafer through a project lens system with exposure light, for producing a position signal indicative of position of said wafer along an axis, comprising:
   (a) a light source for emitting coherent light whose frequency being different from that of said exposure light;
   (b) means including:
      (I) splitting means for splitting said coherent light into first and second light beams;
      (II) first reflecting means for reflecting said first light beam toward a given place of said reticle, said given place being on an annular region within a circle defined by field angle of said project lens system on said reticle; and
      (III) second reflecting means for reflecting said second light beam toward said given place to produce first interference fringes having a pitch of n1 together with said first light beam, said means being arranged to make stripes of said interference fringes perpendicular to said axis;
   (c) achromatizing means provided between said reticle and said project lens system for receiving said first and second light beams passed through said reticle and for achromatizing said project lens system at wavelengths of said coherent light to form second interference fringes on said wafer in correspondence with said first interference fringes with chromatic aberration removed;
   (d) diffraction grating formed on said wafer where said second interference fringes is to be made by said project lens system and said achromatizing means, said diffraction grating producing a position light signal by interference of said diffraction grating with said second interference fringes and for reflecting said second interference fringes by diffraction, pitch of said diffraction grating being n2, stripes of said diffraction grating being arranged perpendicular to said axis, said pitches n1 and n2 being selected such that they make a ratio of an integer; and (e) photodetection means responsive to said position light signal from said diffraction grating received through said project lens system, said achromatizing means, and said reticle for producing said position signal in accordance with intensity of said position light signal.

2. An apparatus as claimed in claim 1, wherein said light source for emitting coherent light includes first and second components, said first and second components being polarized orthogonally with each other, said frequencies of said first and second components being different from each other and said beam splitting means splits said coherent light into said first and second light beams in accordance with polarizing direction of said first and second components, said first and second beams including said first and second components respectively, and further comprising first and second wave plates provided between said polarizing beam splitting means and said wafer for circularly-polarizing said first and second light beams respectively to move fringe pattern of said interference fringes along said axis together with said beam splitting means and thereby, said position signal being modulated by frequency difference between said first and second light beam.

3. An apparatus as claimed in claim 1, further comprising adjusting means provided to said first reflecting means for adjusting reflection angle of said first light beam to change pitch of said second interference fringes.

4. An apparatus as claimed in claim 1, further comprising spatial filtering means provided between said reticle and said photodetection means for removing light from other than said diffraction grating.

5. An apparatus as claimed in claim 1, further comprising third photodetection means responsive to said coherent light for producing a phase reference signal.

6. An apparatus as claimed in claim 1, further comprising a phase difference detector responsive to said position signal and said phase reference signal for producing position controlling signal.

7. An apparatus as claimed in claim 1, wherein said light source comprises a Zeeman laser.

8. An apparatus as claimed in claim 1, wherein said light source comprises a laser and an acoustooptic modulator responsive to light from said laser for generating said first and second components.

9. An apparatus as claimed in claim 1, wherein said achromatizing means changes magnification between said reticle to said wafer in combination with said project lens system.

10. An apparatus as claimed in claim 1, further comprising:

(a) second diffracting grating provided on said reticle and adjacent to said given place for producing a second position light signal by interference of said second diffraction grating with said interference fringes formed on said reticle and for reflecting said interference fringes by diffraction, stripes of said second diffraction grating being arranged perpendicular to said axis; and (b) second photodection means responsive to said second light signal for producing a second position signal from said second diffraction grating.

11. An apparatus as claimed in claim 10, further comprising a phase difference detector responsive to said position signal and said second position signal for producing a second position controlling signal.

12. An apparatus as claimed in claim 11, further comprising spatial filtering means provided between said reticle and said second photodetection means for removing light from other than said diffraction grating.

13. A position signal producing apparatus, for use with an exposure apparatus for project-printing a pattern on reticle onto an wafer through a project lens system with exposure light, for producing a position signal indicative of position of said wafer along an axis, comprising:

(a) a light source for emitting coherent light including first and second components, said first and second components being polarized orthogonally with each other, said frequencies of said first and second components being different from each other and also different from that of said exposure light;

(b) a first diffraction grating provided on a given place of said reticle, said given place being on an annular region within a circle defined by field angle of said project lens system on said reticle, stripes of said first diffraction grating being arranged perpendicular to said axis;

(c) light stopping means provided between said first diffraction grating and said project lens system for stopping non-diffracted said first and second components from said diffraction grating and transmitting diffracted said first and second components from said diffraction grating;

(d) achromatizing means provided between said reticle and said project lens system for receiving said first and second components from said diffraction grating and for achromatizing said project lens system at wavelengths of said first and second components to form interference fringes onto said wafer in correspondence with said first diffraction grating with chromatic aberration removed, pitch of said interference fringes being n1;

(e) a second diffraction grating formed on said wafer where said interference fringes is to be made by said project lens system and said achromatizing means, said second diffraction grating producing a position light signal by interference of said second diffraction grating with said interference fringes and for reflecting said interference fringes by diffraction, pitch of said diffraction grating being n2, stripes of said diffraction grating being arranged perpendicular to said axis, said pitches n1 and n2 being selected such that they makes a ratio of an integer;

(f) first and second polarizing means responsive to said first and second components from said first diffraction grating for circularly-polarizing said first and second light beams respectively to move fringe pattern of said interference fringes along said axis and thereby, said position signal being modulated by frequency difference between said first and second components; and (g) photodetection means responsive to said position light signal from said second diffraction grating received through said project lens system, and said achromatizing means for producing said position signal in accordance with intensity of said position light signal.

14. An apparatus as claimed in claim 13, further comprising spatial filtering means provided between said achromatizing means and said photodetection means for removing light from other than said diffraction grating.

15. An apparatus as claimed in claim 13, further comprising second photodetection means responsive to said coherent light for producing a phase reference signal.

16. An apparatus as claimed in claim 13, further comprising a phase difference detector responsive to said position signal and said phase reference signal for producing position controlling signal.

17. An apparatus as claimed in claim 13, wherein said light source comprises a Zeeman laser.

18. An apparatus as claimed in claim 13, wherein said light source comprises a laser and an acoustooptic modulator responsive to light from said light for generating said first and second components.

19. An apparatus as claimed in claim 13, wherein said achromatizing means changes magnification between said reticle to said wafer in combination with said project lens system.

* * * * *